(12) United States Patent
Cai et al.

(10) Patent No.: US 10,424,748 B2
(45) Date of Patent: Sep. 24, 2019

(54) FLEXIBLE DISPLAY PANEL AND MANUFACTURING METHOD THEREOF, AND FLEXIBLE DISPLAY DEVICE

(71) Applicant: BOE TECHNOLOGY GROUP CO., LTD., Beijing (CN)

(72) Inventors: Peng Cai, Beijing (CN); Ping Song, Beijing (CN); Youwei Wang, Beijing (CN); Jing Yang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/762,471

(22) PCT Filed: Sep. 20, 2017

(86) PCT No.: PCT/CN2017/102515
§ 371 (c)(1),
(2) Date: Mar. 22, 2018

(87) PCT Pub. No.: WO2018/161525
PCT Pub. Date: Sep. 13, 2018

(65) Prior Publication Data
US 2019/0074460 A1    Mar. 7, 2019

(30) Foreign Application Priority Data
Mar. 8, 2017    (CN) .......................... 2017 1 0136170

(51) Int. Cl.
*G02F 1/1333*    (2006.01)
*H01L 51/00*    (2006.01)
(Continued)

(52) U.S. Cl.
CPC .... *H01L 51/0097* (2013.01); *G02F 1/133305* (2013.01); *G02F 1/133308* (2013.01);
(Continued)

(58) Field of Classification Search
None
See application file for complete search history.

(56) References Cited

U.S. PATENT DOCUMENTS 7,524,228 B2 * 4/2009 Imamura ................ H05B 33/04
313/500
10,135,028 B2 * 11/2018 Kim ..................... H01L 27/3244
(Continued)

FOREIGN PATENT DOCUMENTS

| CN | 1533682 A | 9/2004 |
| CN | 102201547 A | 9/2011 |

(Continued)

OTHER PUBLICATIONS

International Search Report issued in International Patent Application No. PCT/CN2017/102515, dated Nov. 30, 2017; with English translation.
(Continued)

*Primary Examiner* — Minh Loan Tran
(74) *Attorney, Agent, or Firm* — McDermott Will & Emery LLP (57) ABSTRACT

A flexible display panel, a manufacturing method thereof and a flexible display device, which relate to the technical field of flexible display and reduce the probability of the occurrence of cracks on an inorganic encapsulation structure when a flexible display panel is bent, so that the service life of light emitting devices in the flexible display substrate is prolonged. The flexible display panel includes a flexible display substrate and an encapsulation structure arranged on a surface of the flexible display substrate. A portion of the encapsulation structure corresponding to a non-display region is an inorganic encapsulation structure. The flexible display panel further includes an organic encapsulation layer covering the inorganic encapsulation structure. The manufacturing method of a flexible display panel manufacture the
(Continued)

flexible display panel described in the above technical solutions. The flexible display panel provided by the present disclosure is used in a flexible display device.

20 Claims, 2 Drawing Sheets

(51) Int. Cl.
*H01L 51/52* (2006.01)
*H01L 27/32* (2006.01)

(52) U.S. Cl.
CPC ...... *H01L 51/0005* (2013.01); *H01L 51/5237* (2013.01); *H01L 51/5246* (2013.01); *H01L 51/5253* (2013.01); *H01L 51/5256* (2013.01); *H01L 51/5259* (2013.01); *H01L 51/5278* (2013.01); *H01L 27/3244* (2013.01); *H01L 51/525* (2013.01); *H01L 2251/5338* (2013.01); *H01L 2251/566* (2013.01)

(56) References Cited

U.S. PATENT DOCUMENTS

2009/0179566 A1   7/2009  Imamura
2011/0234477 A1*  9/2011  Sano .................. H01L 51/0097
                                                          345/77
2015/0162392 A1*  6/2015  Lim .................... H01L 27/3244
                                                          257/72
2016/0133874 A1*  5/2016  Kim .................... H01L 51/5259
                                                          257/40
2017/0365814 A1*  12/2017 Kim .................... H01L 51/5246
2018/0226607 A1   8/2018  Li et al.

FOREIGN PATENT DOCUMENTS

CN   105374947 A   3/2016
CN   105895827 A   8/2016
CN   106653820 A   5/2017

OTHER PUBLICATIONS

Written Opinion issued in International Patent Application No. PCT/CN2017/102515, dated Nov. 30, 2017; with English translation.

Notification of the First Office Action issued in Chinese Patent Application No. 201710136170.6, dated Apr. 4, 2018; with English translation.

Notification of the Second Office Action issued in Chinse Patent Application No. 201710136170.6, dated Oct. 18, 2018; with English translation.

* cited by examiner

FIG. 1

(PRIOR ART)

FLEXIBLE DISPLAY PANEL AND MANUFACTURING METHOD THEREOF, AND FLEXIBLE DISPLAY DEVICE

CROSS-REFERENCE TO RELATED APPLICATION

This application is the U.S. National Phase under 35 U.S.C. § 371 of International Patent Application No. PCT/CN2017/102515, filed on Sep. 20, 2017, which in turn claims the benefit of Chinese Patent Application No. 201710136170.6 filed to the China Patent Bureau on Mar. 8, 2017 and entitled "FLEXIBLE DISPLAY PANEL AND MANUFACTURING METHOD THEREOF, AND FLEXIBLE DISPLAY DEVICE", the entire disclosures of which Applications are incorporated by reference herein.

TECHNICAL FIELD

The present disclosure relates to the technical field of flexible display, and in particular to a flexible display panel and a manufacturing method thereof, and a flexible display device.

BACKGROUND

Figure 1:
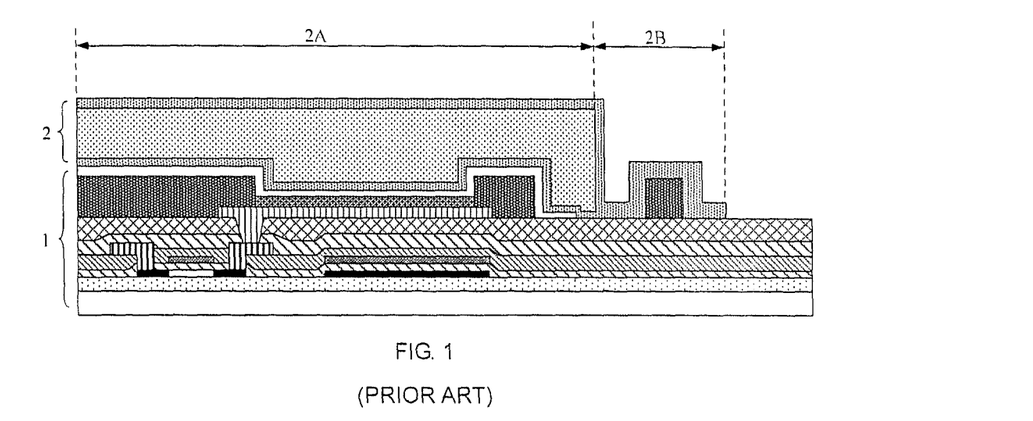
FIG. 1 is a schematic structure diagram of a flexible display panel in the related art.

As shown in FIG. 1, an existing flexible display panel generally includes a flexible display substrate 1 and an encapsulation structure 2 arranged on a surface of the flexible display substrate which is used to reduce water vapor and oxygen entering the flexible display substrate, thus light emitting devices in the flexible display substrate 2 are protected, and the reduction of the service life of the light emitting devices caused by water vapor and oxygen is avoided.

However, in the related art, a portion of the encapsulation structure 2 corresponding to a display region of the flexible display substrate 1 is a stacked encapsulation structure 2A, and a portion of the encapsulation structure 2 corresponding to a non-display region of the flexible display substrate 1 is generally an inorganic encapsulation structure 2B. Although the stacked encapsulation structure 2A can prevent water vapor and oxygen from entering the flexible display substrate very well, cracks is easily occurred on the inorganic encapsulation structure 2B due to the bending stress during the bending of the flexible display device, so that water vapor and oxygen enter the flexible display substrate through cracks on the inorganic encapsulation structure 2B, resulting the reduction of the service life of the light emitting devices in the flexible display substrate 1.

SUMMARY

The present disclosure provides the following solutions.

In a first aspect, a flexible display panel is provided, including a flexible display substrate and an encapsulation structure arranged on a surface of the flexible display substrate, a portion of the encapsulation structure corresponding to a non-display region being an inorganic encapsulation structure; and the flexible display panel further includes an organic encapsulation layer covering the inorganic encapsulation structure.

In combination with the first aspect, in a first possible implementation of the first aspect, a portion of the encapsulation structure corresponding to a display region is a stacked encapsulation structure; a first barrier layer configured to prevent a diffusion of the organic encapsulation layer is further formed in a portion of the surface of the flexible display substrate corresponding to the non-display region; and, the organic encapsulation layer is located between the first barrier layer and the stacked encapsulation structure.

In combination with the first possible implementation of the first aspect, in a second possible implementation of the first aspect, a material of the first barrier layer is organic material.

In combination with the first possible implementation of the first aspect, in a third possible implementation of the first aspect, cutting seams are further formed in the portion of the surface of the flexible display substrate corresponding to the non-display region, and the first barrier layer is arranged on surfaces of the cutting seams.

In combination with the third possible implementation of the first aspect, in a fourth possible implementation of the first aspect, the flexible display substrate includes an array substrate; a light emitting unit is formed in a portion of a surface of the array substrate corresponding to the display region; the cutting seams and the inorganic encapsulation structure are formed in a portion of the surface of the array substrate corresponding to the non-display region, respectively; and, an orthographic projection of the inorganic encapsulation structure on the surface of the array substrate is located between an orthographic projection of the light emitting unit on the surface of the array substrate and an orthographic projection of the cutting seams on the surface of the array substrate.

In combination with any one of the first to the fourth possible implementations of the first aspect, in a fifth possible implementation of the first aspect, a height of a surface of the organic encapsulation layer away from the flexible display substrate does not exceed a height of a surface of the stacked encapsulation structure away from the flexible display substrate.

In combination with the fifth possible implementation of the first aspect, in a sixth possible implementation of the first aspect, an upper surface of the first barrier layer is flush with an upper surface of the organic encapsulation layer.

In combination with any one of the first to the fourth possible implementations of the first aspect, in a seventh possible implementation of the first aspect, the stacked encapsulation structure is integrated with the organic encapsulation layer; and/or, the organic encapsulation layer is integrated with the first barrier layer.

In combination with any one of the first to the fourth possible implementations of the first aspect, in an eighth possible implementation of the first aspect, the encapsulation structure includes a first inorganic barrier layer, a second inorganic barrier layer and an organic barrier layer arranged between the first inorganic barrier layer and the second inorganic barrier layer, and the first inorganic barrier layer comes into contact with the surface of the flexible display substrate; wherein, the stacked encapsulation structure includes the organic barrier layer, a portion of the first inorganic barrier layer corresponding to the display region, and a portion of the second inorganic barrier layer corresponding to the display region; the inorganic encapsulation structure includes a portion of the first inorganic barrier layer corresponding to the non-display region and a portion of the second inorganic barrier layer corresponding to the non-display region; and a second barrier layer is arranged between the first inorganic barrier layer and the portion of the surface of the flexible display substrate corresponding to the non-display region.

In combination with the eighth possible implementation of the first aspect, in a ninth possible implementation of the first aspect, materials of the first barrier layer, the second barrier layer and the organic barrier layer are same.

In a second aspect, a manufacturing method of a flexible display panel is provided, including: providing a flexible display substrate, the flexible display substrate including a display region and a non-display region; forming an encapsulation structure on a surface of the flexible display substrate, a portion of the encapsulation structure corresponding to the non-display region being an inorganic encapsulation structure; and, forming an organic encapsulation layer covering the inorganic encapsulation structure on a surface of the inorganic encapsulation structure.

In combination with the second aspect, in a first possible implementation of the second aspect, steps of providing a flexible display substrate include: providing an array substrate; forming a first barrier layer in a portion of an upper surface of the array substrate corresponding to the non-display region; and forming a light emitting unit in a portion of the upper surface of the array substrate corresponding to the display region; and, steps of forming an organic encapsulation layer covering the inorganic encapsulation structure on a surface of the inorganic encapsulation structure include: forming the organic encapsulation layer in a groove formed by the inorganic encapsulation structure, the first barrier layer and a stacked encapsulation structure that is a portion of the encapsulation structure corresponding to the display region.

In combination with the first possible implementation of the second aspect, in a second possible implementation of the second aspect, steps of forming a first barrier layer in a portion of an upper surface of the array substrate corresponding to the non-display region includes: forming cutting seams in the portion of the upper surface of the array substrate corresponding to the non-display region; and, forming the first barrier layer on surfaces of the cutting seams.

In combination with the first possible implementation of the second aspect, in a third possible implementation of the second aspect, the forming a first barrier layer in a portion of an upper surface of the array substrate corresponding to the non-display region includes: forming the first barrier layer by means of exposure and development; the step of forming a light emitting unit in a portion of the upper surface of the array substrate corresponding to the display region includes: forming the light emitting unit by means of inkjet printing; and, the step of forming an organic encapsulation layer covering the inorganic encapsulation structure on a surface of the inorganic encapsulation structure includes: forming the organic encapsulation layer by using an inkjet printing technology.

In a third aspect, a flexible display device is provided, including the flexible display panel provided in the first aspect.

BRIEF DESCRIPTION OF THE DRAWINGS

The drawings described herein are used for providing further understanding of the present disclosure and constitute a part of the present disclosure. Illustrative embodiments of the present disclosure and descriptions thereof are used for explaining the present disclosure, but do not constitute inappropriate limitations to the present disclosure. In which.

DETAILED DESCRIPTION

To further describe the embodiments of the present disclosure, the detailed description will be given below with reference to the drawings of the specification. Technical solutions in the embodiments of the present disclosure will be clearly and completely described below with reference to the drawings in the embodiments of the present disclosure. Apparently, the embodiments described herein are merely a part but not all of the embodiments of the present disclosure. All other embodiments obtained by a person of ordinary skill in the art without paying any creative effort on the basis of the embodiments of the present disclosure shall fall into the protection scope of the present disclosure.

An objective of the present disclosure is to provide a flexible display panel and a manufacturing method thereof, and a flexible display device, which reduce the probability of occurrence of cracks on an inorganic encapsulation structure when a flexible display panel is bent so that the service life of light emitting devices in the flexible display substrate is prolonged.

Embodiment 1

Figure 2:
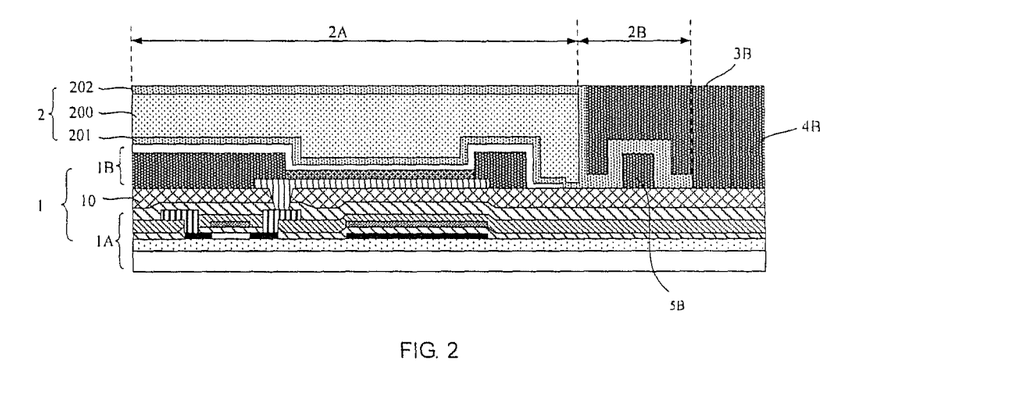
FIG. 2 is a schematic structure diagram of a flexible display panel without cutting seams according to Embodiment 1 of the present disclosure.
Figure 3:
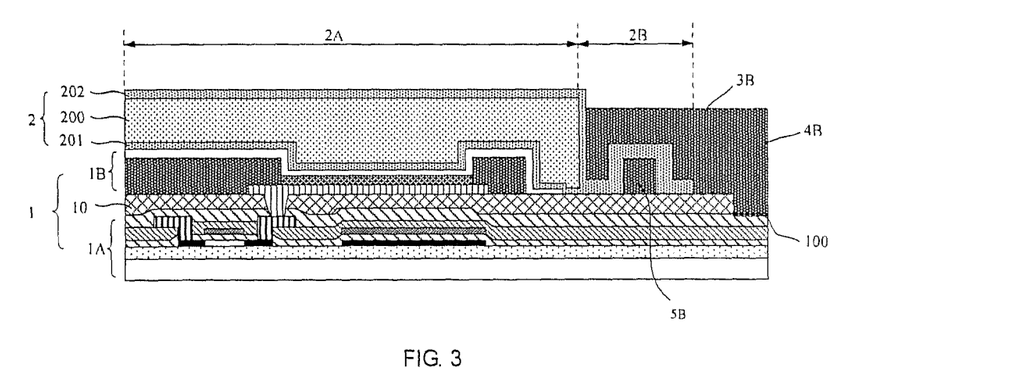
FIG. 3 is a schematic structure diagram of a flexible display panel with cutting seams according to Embodiment 1 of the present disclosure.

Referring to FIG. 2 and FIG. 3, embodiments of the present disclosure provide a flexible display panel, including a flexible display substrate 1 and an encapsulation structure 2 arranged on a surface of the flexible display substrate 1. A portion of the encapsulation structure 2 corresponding to a non-display region is an inorganic encapsulation structure 2B. The flexible display panel further includes an organic encapsulation layer 3B covering the inorganic encapsulation structure 2B.

The flexible display panel will generate a bending stress when being bent, and the bending stress is absorbed by the organic encapsulation layer 3B, so that the bending stress acting on the inorganic encapsulation structure 2B is reduced.

It can be known from the bending process of the flexible display panel provided in the embodiments that, since the organic encapsulation layer 3B covers the inorganic encapsulation structure 2B and the organic encapsulation layer 3B is made of organic material, so the organic encapsulation layer 3B has excellent shrinkage and diffusion performances, and thereby the organic encapsulation layer 3B can absorb the bending stress acting on the inorganic encapsulation structure 2B when the flexible display panel is bent. Accordingly, the probability of the occurrence of cracks on the inorganic encapsulation structure 2B when the flexible display panel is bent is decreased, and it is able to avoid the problem of the reduction of the service life of light emitting devices in the flexible display substrate 1 caused by the entering of the water vapor and oxygen into the flexible display substrate 1 through the cracks on the inorganic encapsulation structure 2B.

Moreover, by covering the organic encapsulation layer 3B on the inorganic encapsulation structure 2B, the inorganic encapsulation structure 2B is protected, and the inorganic encapsulation structure 2B is prevented from being damaged in the subsequent technological processes (for example, fitting, removing a release film, and fitting OCA or the like).

It can be understood that, in the embodiments, a portion of the encapsulation structure 2 corresponding to a display region is a stacked encapsulation structure 2A. A first barrier layer 4B configured to prevent a diffusion of the organic encapsulation layer 3B is further formed in a portion of the surface of the flexible display substrate 1 corresponding to the non-display region, and the organic encapsulation layer 3B is located between the first barrier layer 4B and the stacked encapsulation structure 2A. Thus, during the manufacturing process of the flexible display panel, if it is required to manufacture the organic encapsulation layer 3B, the first barrier layer 4B can be manufactured firstly, the first barrier layer 4B, the inorganic encapsulation structure 2B and the stacked encapsulation structure 2A can form a groove, and then the organic encapsulation layer 3B can be manufactured within the groove, so that an irregular diffusion of the organic encapsulation layer 3B during the manufacturing process can be avoided. As already mentioned above, since the organic encapsulation layer 3B has excellent shrinkage and diffusion performances, if the flexible display panel is bent when in use, the organic encapsulation layer 3B absorbs the bending stress and thus results in the irregular diffusion, the first barrier layer 4B and the stacked encapsulation structure 2A can also ensure that the irregular diffusion will not occur in the organic encapsulation layer 3B.

Specifically, the first barrier layer 4B may be made of a variety of materials as long as the first barrier layer 4B can prevent the diffusion of the organic encapsulation layer 3B. However, considering it is difficult to manufacture a high first barrier layer 4B using inorganic material, a material of the first barrier layer 4B may be organic material which has an advantage of manufacture the high first barrier layer 4B easily, so as to use the advantage of the organic material to improve the barrier performance of the first barrier layer 4B to the organic encapsulation layer 3B, and thereby the irregular diffusion of the organic encapsulation layer 3B is further prevented.

Referring to FIG. 3, a plurality of cutting seams 100 will be further formed in the flexible display panel, so that it is convenient to cut the flexible display panel of a large area into flexible display panels of a required area. The cutting seams 100 are formed in a portion of the surface of the flexible display substrate 1 corresponding to the non-display region. When there is no any covering on the surface of the flexible display panel, it can be ensured that the cutting of the flexible display panel will not be obstructed by the covering. However, the cutting seams 100 are easily influenced by the bending stress during the bending process of the flexible display panel if there is no any covering on the surface of the flexible display panel, and cracks thus occur in a portion of the flexible display substrate 1 corresponding to the cutting seams 100, so that water vapor and oxygen can enter the flexible display substrate 1 through the cracks on the cutting seams 100, and the service life of light emitting devices in the flexible display substrate is thus influenced.

To overcome above problems, referring to FIG. 3, in the embodiment, the cutting seams 100 are further formed in a portion of the surface of the flexible display substrate 1 corresponding to the non-display region, and the first barrier layer 4B is provided on the surfaces of the cutting seams 100. In this way, the first barrier layer 4B can not only prevent the irregular diffusion of the organic encapsulation layer 3B but also absorb the bending stress acting on the cutting seams 100 when the flexible display panel is bent. Therefore, the bending stress acting on the cutting seams 100 is reduced, and no cracks will occur on the cutting seams 100.

It should be noted that, no matter in the flexible display panel shown in FIG. 2 or in the flexible display panel shown in FIG. 3, the first barrier layer 4B, the inorganic encapsulation structure 2B and the stacked encapsulation structure 2A need to form a groove, so that the organic encapsulation layer 3B can be filled within the groove. Moreover, in the flexible display panel shown in FIG. 3, if an orthographic projection of the first barrier layer 4B on the flexible display substrate does not completely cover the cutting seams 100 formed on the flexible display substrate, the groove further includes a space surrounded by the first barrier layer 4B, the cutting seams 100 and the inorganic encapsulation structure 2B. In this case, when the organic encapsulation layer 3B is filled within the groove, the organic encapsulation layer 3B can not only absorb the bending stress acting on the inorganic encapsulation structure 2B but also absorb the bending stress acting on the cutting seams 100 when the flexible display panel is bent, so that water vapor and oxygen are further prevented from entering the flexible display substrate.

Further, referring to FIG. 2 and FIG. 3, in the embodiment, the stacked encapsulation structure 2A is integrated with the organic encapsulation layer 3B; and/or, the organic encapsulation layer 3B is integrated with the first barrier layer 4B. When the stacked encapsulation structure 2A is integrated with the organic encapsulation layer 3B, the organic encapsulation layer 3B can be allowed firmly covered on the inorganic encapsulation structure 2B by the stacked encapsulation structure 2A, so that the organic encapsulation layer 3B is ensured to absorb the bending stress acting on the inorganic encapsulation structure 2B well. And, the first barrier layer 4B can prevent the irregular diffusion of the organic encapsulation layer better when the organic encapsulation layer 3B is integrated with the first barrier layer 4B.

Optionally, in the embodiments, the stacked encapsulation structure 2A is integrated with the organic encapsulation layer 3B, and the organic encapsulation layer 3B is integrated with the first barrier layer 4B, so that the stacked encapsulation structure 2A, the organic encapsulation layer 3B and the first barrier layer 4B become one. In this way, the stability of the organic encapsulation layer 3B and the first barrier layer 4B can be improved. Moreover, referring to FIG. 3, the organic encapsulation layer 3B can cooperate with the first barrier layer 4B to completely absorb the bending stress acting on the inorganic encapsulation structure 2B and the cutting seams 100 during the fabrication of the first barrier layer 4B on the surfaces of the cutting seams 100.

Optionally, no matter in the flexible display panel shown in FIG. 2 or in the flexible display panel shown in FIG. 3, a height of a surface of the organic encapsulation layer 3B away from the flexible display substrate 1 does not exceed the height of a surface of the stacked encapsulation structure 2A away from the flexible display substrate 1.

In other words, FIG. 2 shows a case in which the height of the surface of the organic encapsulation layer 3B away from the flexible display substrate 1 in the flexible display panel provided in the embodiment is consistent with the height of the surface of the stacked encapsulation structure 2A away from the flexible display substrate 1, and FIG. 3 shows a case in which the height of the surface of the organic encapsulation layer 3B away from the flexible display substrate 1 in the flexible display panel provided in the embodiments is lower than the height of the surface of the stacked encapsulation structure 2A away from the flexible display substrate 1.

Referring to FIG. 1, in the encapsulation structure 2 of the existing flexible display panel, since the height of the surface of the stacked encapsulation structure 2A away from the flexible display substrate 1 is higher than the height of the surface of the inorganic encapsulation structure 2B away from the flexible display substrate 1, the surface of the encapsulation structure 2 is uneven. In this way, a problem of functional wear due to the unevenness of the surface of the encapsulation structure 2 may occur when a functional film layer is manufactured on a surface of the encapsulation structure 2 formed on the flexible display panel. Therefore, optionally, referring to FIG. 2, in the flexible display panel provided in the embodiments, the height of the surface of the organic encapsulation layer 3B away from the flexible display substrate 1 is consistent with the height of the surface of the stacked encapsulation structure 2A away from the flexible display substrate 1. In this way, an upper surface of the whole flexible display panel is flat, so that the problem of functional wear due to the unevenness of an upper surface of the encapsulation structure 2 may not occur when the functional film layer is manufactured on the upper surface of the flexible display panel.

Further, when an upper surface of the first barrier layer 4B is flushed with an upper surface of the organic encapsulation layer 3B, the flatness of the upper surface of the flexible display panel can be improved, and the problem of the functional wear due to the unevenness of the upper surface of the flexible display panel is also reduced.

The flexible display panel provided in the embodiments will be further described below in detail with reference to FIG. 3.

1. Flexible Display Substrate

Referring to FIG. 3, as the flexible display substrate 1 in the embodiments, a wide range of flexible display substrates can be used. For example, an OLED display substrate is a very common flexible display substrate. The flexible display substrate includes an array substrate 1A. A light emitting unit 1B is formed in a portion of a surface of the array substrate corresponding to the display region. Cutting seams 100 and an inorganic encapsulation structure 2B are respectively formed in a portion of the surface of the array substrate 1A corresponding to the non-display region. An orthographic projection of the inorganic encapsulation structure 2B on the surface of the array substrate is located between an orthographic projection of the light emitting unit 1B on the surface of the array substrate 1A and an orthographic projection of the cutting seams 100 on the surface of the array substrate 1A, so that the cutting seams 100 are located on the edge of the flexible display substrate, and it is thus ensured that important components in the flexible display panel will not be damaged when cutting of the display panel.

Referring to FIG. 3, in order to ensure that the light emitting unit 1B can be better formed on the surface of the array substrate 1A, after the cutting seams 100 are formed in the portion of the surface of the array substrate 1A corresponding to the non-display region, a planarization layer 10 is formed in the other portion of the array substrate 1A, and then the light emitting unit 1B is formed in a portion of a surface of the planarization layer 10 corresponding to the display region. In other words, in the portion corresponding to the display region, by limiting the light limiting unit 1B on the surface of the planarization layer 10, a problem of uneven light emission caused by the unevenness of the surface on which the light emitting unit 1B is located is avoided, and the uniformity of light emitted by the light emitting unit 1B is improved.

Specifically, the array substrate 1A includes a substrate 10A and a thin film transistor array formed on a surface of the substrate 10A. The number of thin film transistors in the thin film transistor array corresponds to the number of the light emitting devices in the light emitting unit 1B.

The thin film transistors in the thin film transistor array may also be selected according to actual requirements, for example, the thin film transistors can be common thin film transistors of a top-gate structure or thin film transistors of a bottom-gate structure. Although the thin film transistors shown in FIG. 2 and FIG. 3 are thin film transistors of a top-gate structure, it does not rule out that the thin film transistors of a bottom-gate structure can be selected. The light emitting unit 1B includes a pixel defining layer. The pixel defining layer includes a plurality of pixel openings, and a light emitting device is provided within each of the pixel openings. In other words, the number of the pixel openings is the same as the number of the light emitting devices. Moreover, since each light emitting device is controlled by one thin film transistor, the number of the pixel openings, the number of the light emitting devices and the number of the thin film transistors are in one-to-one correspondence.

Each light emitting device includes a first electrode layer, a second electrode layer and a light-emitting layer. The light-emitting layer is located between the first electrode layer and the second electrode layer, the first electrode layer comes into contact with the planarization layer 10, and the first electrode layer is connected to a signal output end of the thin film transistor. When the first electrode layer is an anode, the second electrode layer is a cathode. And, when the first electrode layer is a cathode, the second electrode layer is an anode.

Further, each thin film transistor includes an active layer formed on the surface of the substrate, a gate insulating layer formed on a surface of the active layer, a gate layer formed on a surface of the gate insulating layer, an interlayer insulating layer formed between a surface of the gate layer and the surface of the gate insulating layer, a source and a drain formed on a surface of the interlayer insulating layer, and a passivation layer formed on surfaces of the source, the drain and the interlayer insulating. The source and the drain are connected to the active layer through via holes formed in the interlayer insulating layer and the gate insulating layer. The planarization layer 10 is formed on a surface of the passivation layer. The first electrode layer may be connected to the source or may be connected to the drain as long as it is ensured that the thin film transistor is connected to the first electrode layer.

In addition, the substrate 10A is a flexible substrate which is made of a variety of materials. For example, the flexible substrate may be made of one or more of polyimide, polycarbonate, polyacrylate, polyetherimide, polyether sulfone, polyethylene glycol terephthalate and polyethylene naphthalate.

2. Encapsulation Structure

Referring to FIG. 3, the encapsulation structure 2 includes a first inorganic barrier layer 201, a second inorganic barrier layer 202 and an organic barrier layer 200 arranged between the first inorganic barrier layer 201 and the second inorganic barrier layer 202. The first inorganic barrier layer 201 comes into contact with the surface of the flexible display substrate 1. The stacked encapsulation structure 2A includes the organic barrier layer 200, a portion of the first inorganic barrier layer 201 corresponding to the display region and a portion of the second inorganic barrier layer 202 corresponding to the display region.

The inorganic encapsulation structure 2B includes a portion of the first inorganic barrier layer 201 corresponding to the non-display region and a portion of the second inorganic barrier layer 202 corresponding to the non-display region. A second barrier layer 5B is provided between the first inorganic barrier layer 201 and a portion of the surface of the flexible display substrate 1 corresponding to the non-display region, so that the second barrier layer 5B can prevent the irregular diffusion of the organic barrier layer 200.

It should be noted that, in order to increase the capability of the second barrier layer 5B of preventing the irregular diffusion of the organic barrier layer 200, a material of the second barrier layer 5B may be organic material. The principle of the second barrier layer 5B may refer to that of the first barrier layer 4B. In addition, for convenience of raw material purchase, materials of the first barrier layer 4B, the second barrier layer 5B and the organic barrier layer 200 are same. In this way, it is not only convenient for raw material purchase but also able to recycle the remaining organic material and waste organic material, so that the production cost is reduced.

Embodiment 2

Figure 4:
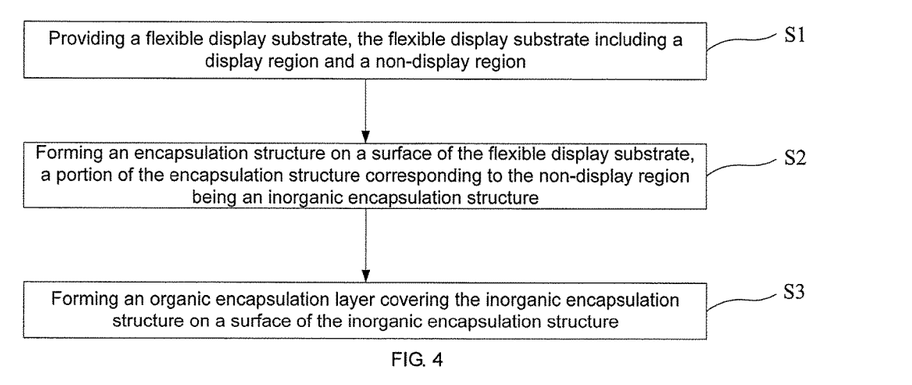
FIG. 4 is a flowchart of a method for manufacturing a flexible display panel according to Embodiment 2 of the present disclosure.

Referring to FIG. 2 to FIG. 4, some embodiments of the present disclosure further provide a manufacturing method of a flexible display panel, including steps 1-3 (S1-S3).

S1: providing a flexible display substrate 1, the flexible display substrate 1 including a display region and a non-display region.

S2: forming an encapsulation structure 2 on a surface of the flexible display substrate 1, a portion of the encapsulation structure 2 corresponding to the non-display region being an inorganic encapsulation structure 2B.

S3: forming an organic encapsulation layer 3B covering the inorganic encapsulation structure 2B on a surface of the inorganic encapsulation structure 2B.

Compared with the related art, the beneficial effects of the manufacturing method of a flexible display panel provided in the embodiments of the present disclosure are the same as the beneficial effects of the flexible display panel provided in Embodiment 1 and will not be repeated here.

Figure 5:
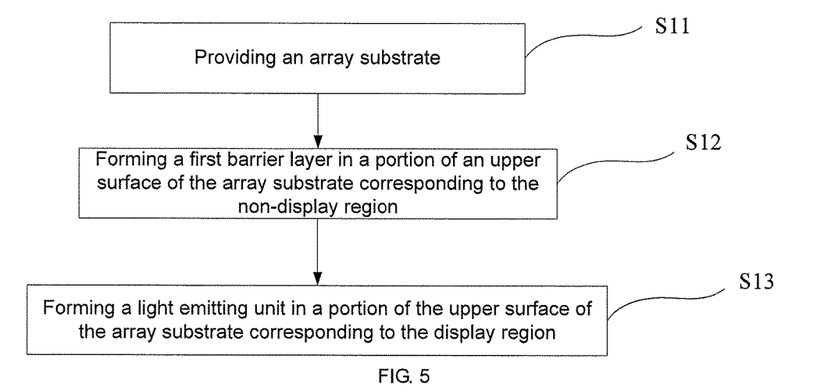
FIG. 5 is a flowchart of a method for providing a flexible substrate according to Embodiment 2 of the present disclosure.

Specifically, in S1, referring to FIGS. 2-3 and FIG. 5, steps of providing a flexible display substrate include step 11-13 (S11-S13).

S11: providing an array substrate 1A.

S12: forming a first barrier layer 4B in a portion of an upper surface of the array substrate 1A corresponding to the non-display region.

S13: forming a light emitting unit 1B in a portion of the upper surface of the array substrate 1A corresponding to the display region.

In S3, steps of forming an organic encapsulation layer 3B covering the inorganic encapsulation structure 2B on a surface of the inorganic encapsulation structure 2B include: referring to FIG. 2 and FIG. 3, forming an organic encapsulation layer 3B in a groove formed by the inorganic encapsulation structure 2B, the first barrier layer 4B and a stacked encapsulation structure 2A that is a portion of the encapsulation structure 2 corresponding to the display region.

The step of forming a first barrier layer 4B in a portion of an upper surface of the array substrate 1A corresponding to the non-display region includes:

forming cutting seams 100 in the portion of the upper surface of the array substrate 1A corresponding to the non-display region; and forming the first barrier layer 4B on surfaces of the cutting seams 100 so that the first barrier layer 4B can cover the cutting seams 100.

Since the organic material in light emitting devices in the light emitting unit 1B has a high photosensitivity, in order to minimize the influence on the quality of the light emitting devices during the manufactory of the flexible display panel, the first barrier layer 4B may be formed in the portion of the upper surface of the array substrate 1A corresponding to the non-display region by means of exposure and development before the light emitting unit 1B is formed in the portion of the upper surface of the array substrate 1A corresponding to the display region. And, the light emitting unit 1B is formed in the portion of the upper surface of the array substrate 1A corresponding to the display region by means of inkjet printing, thereby reducing the influence on the light emitting devices in the light emitting unit 1B during the formation of the light emitting unit by exposure and development.

The organic encapsulation layer 3B covering the inorganic encapsulation structure 2B is formed on the surface of the inorganic encapsulation structure 2B by using an inkjet printing technology, thereby reducing the influence on the light emitting devices in the light emitting unit 1B during the formation of the organic encapsulation layer 3B by exposure and development.

In addition, referring to FIG. 3, before the light emitting unit 1B is formed in the portion of the upper surface of the array substrate 1A corresponding to the display region, a planarization layer 10 may be formed on the upper surface of the array substrate 1A, and then the light emitting unit 1B may be formed on the planarization layer 10.

Embodiment 3

Referring to FIG. 2 and FIG. 3, embodiments of the present disclosure further provide a flexible display device including the flexible display panel provided in Embodiment 1.

Compared with the related art, the beneficial effects of the flexible display device provided in the embodiments of the present disclosure are the same as the beneficial effects of the flexible display panel provided in Embodiment 1 and will not be repeated here.

The flexible display device provided in the above embodiments may be a mobile phone, a tablet computer, a TV set, a display, a notebook computer, a digital photo frame, a navigation device or any products or components having a display function.

In the descriptions of the above embodiments, specific features, structures, materials or characteristics can be combined appropriately in any one or more embodiments or examples.

The foregoing descriptions merely show specific implementations of the present disclosure, and the protection scope of the present disclosure is not limited thereto. Any person of skill in the art can readily conceive of variations or replacements within the technical scope disclosed by the embodiments of the present disclosure, and these variations or replacements shall fall into the protection scope of the present disclosure. Accordingly, the protection scope of the present disclosure shall be subject to the protection scope of the claims.

What is claimed is:

1. A flexible display panel, comprising:
   a flexible display substrate;
   an encapsulation structure arranged on a surface of the flexible display substrate, a portion of the encapsulation structure corresponding to a non-display region being an inorganic encapsulation structure; and
   an organic encapsulation layer including:
   a portion disposed on and covering a surface of the inorganic encapsulation structure facing away from the flexible display substrate; and
   a remaining portion disposed on the surface of the flexible display substrate and covering a side surface of the organic encapsulation layer away from a remaining portion of the encapsulation structure.

2. The flexible display panel according to claim 1, wherein, a portion of the encapsulation structure corresponding to a display region is a stacked encapsulation structure; a first barrier layer configured to prevent a diffusion of the organic encapsulation layer is further formed on a portion of the surface of the flexible display substrate corresponding to the non-display region; and, the organic encapsulation layer is located between the first barrier layer and the stacked encapsulation structure.

3. The flexible display panel according to claim 2, wherein, a material of the first barrier layer is organic material.

4. The flexible display panel according to claim 2, wherein, cutting seams are further formed in the portion of the surface of the flexible display substrate corresponding to the non-display region, and the first barrier layer is arranged on surfaces of the cutting seams.

5. The flexible display panel according to claim 4, wherein, the flexible display substrate comprises an array substrate; a light emitting unit is formed on a portion of a surface of the array substrate corresponding to the display region; the cutting seams and the inorganic encapsulation structure are formed in a portion of the surface of the array substrate corresponding to the non-display region, respectively; and, an orthographic projection of the inorganic encapsulation structure on the surface of the array substrate is located between an orthographic projection of the light emitting unit on the surface of the array substrate and an orthographic projection of the cutting seams on the surface of the array substrate.

6. The flexible display panel according to claim 2, wherein, a height of a surface of the organic encapsulation layer away from the flexible display substrate does not exceed a height of a surface of the stacked encapsulation structure away from the flexible display substrate.

7. The flexible display panel according to claim 6, wherein, an upper surface of the first barrier layer is flush with an upper surface of the organic encapsulation layer.

8. The flexible display panel according to claim 2, wherein, the stacked encapsulation structure is integrated with the organic encapsulation layer; and/or,
   the organic encapsulation layer is integrated with the first barrier layer.

9. The flexible display panel according to claim 2, wherein, the encapsulation structure comprises a first inorganic barrier layer, a second inorganic barrier layer and an organic barrier layer arranged between the first inorganic barrier layer and the second inorganic barrier layer, and the first inorganic barrier layer comes into contact with the surface of the flexible display substrate; wherein,
   the stacked encapsulation structure comprises the organic barrier layer, a portion of the first inorganic barrier layer corresponding to the display region, and a portion of the second inorganic barrier layer corresponding to the display region;
   the inorganic encapsulation structure comprises a portion of the first inorganic barrier layer corresponding to the non-display region and a portion of the second inorganic barrier layer corresponding to the non-display region; and
   a second barrier layer is arranged between the first inorganic barrier layer and the portion of the surface of the flexible display substrate corresponding to the non-display region.

10. The flexible display panel according to claim 9, wherein, materials of the first barrier layer, the second barrier layer and the organic barrier layer are same.

11. A flexible display device, comprising the flexible display panel according to claim 1.

12. A manufacturing method of a flexible display panel, comprising:
    providing a flexible display substrate, the flexible display substrate comprising a display region and a non-display region;
    forming an encapsulation structure on a surface of the flexible display substrate, a portion of the encapsulation structure corresponding to the non-display region being an inorganic encapsulation structure; and
    forming an organic encapsulation layer, wherein a portion of the organic encapsulation layer covering the inorganic encapsulation structure is formed on a surface of the inorganic encapsulation structure facing away from the flexible display substrate, and a remaining portion of the organic encapsulation layer covering a side surface of the organic encapsulation layer away from a remaining portion of the encapsulation structure is formed on the surface of the flexible display substrate.

13. The manufacturing method of a flexible display panel according to claim 12, wherein:
    steps of providing a flexible display substrate comprises:
    providing an array substrate;
    forming a first barrier layer in a portion of an upper surface of the array substrate corresponding to the non-display region; and
    forming a light emitting unit in a portion of the upper surface of the array substrate corresponding to the display region; and
    forming an organic encapsulation layer covering the inorganic encapsulation structure on a surface of the inorganic encapsulation structure comprises: forming the organic encapsulation layer in a groove formed by the inorganic encapsulation structure, the first barrier layer and a stacked encapsulation structure that is a portion of the encapsulation structure corresponding to the display region.

14. The manufacturing method of a flexible display panel according to claim 13, wherein, steps of forming a first barrier layer in a portion of an upper surface of the array substrate corresponding to the non-display region comprise:

forming cutting seams in the portion of the upper surface of the array substrate corresponding to the non-display region; and forming the first barrier layer on surfaces of the cutting seams.

15. The manufacturing method of a flexible display panel according to claim 13, wherein, forming a first barrier layer on a portion of an upper surface of the array substrate corresponding to the non-display region comprises: forming the first barrier layer by means of exposure and development;

forming a light emitting unit on a portion of the upper surface of the array substrate corresponding to the display region comprises: forming the light emitting unit by means of inkjet printing; and forming an organic encapsulation layer covering the inorganic encapsulation structure on a surface of the inorganic encapsulation structure comprises: forming the organic encapsulation layer by using an inkjet printing technology.

16. A flexible display panel, comprising:

a flexible display substrate;

an encapsulation structure arranged on a surface of the flexible display substrate, a portion of the encapsulation structure corresponding to a non-display region being an inorganic encapsulation structure, and a portion of the encapsulation structure corresponding to a display region being a stacked encapsulation structure;

an organic encapsulation layer covering the inorganic encapsulation structure; and a first barrier layer disposed on a portion of the surface of the flexible display substrate corresponding to the non-display region, wherein the first barrier layer is configured to prevent a diffusion of the organic encapsulation layer, and the organic encapsulation layer is located between the first barrier layer and the stacked encapsulation structure.

17. The flexible display panel according to claim 16, further comprising cutting seams formed in the portion of the surface of the flexible display substrate corresponding to the non-display region, and the first barrier layer is arranged on surfaces of the cutting seams.

18. The flexible display panel according to claim 17, wherein, the flexible display substrate comprises an array substrate; a light emitting unit is formed on a portion of a surface of the array substrate corresponding to the display region; the cutting seams and the inorganic encapsulation structure are formed on a portion of the surface of the array substrate corresponding to the non-display region, respectively; and, an orthographic projection of the inorganic encapsulation structure on the surface of the array substrate is located between an orthographic projection of the light emitting unit on the surface of the array substrate and an orthographic projection of the cutting seams on the surface of the array substrate.

19. The flexible display panel according to claim 16, wherein a height of a surface of the organic encapsulation layer away from the flexible display substrate does not exceed a height of a surface of the stacked encapsulation structure away from the flexible display substrate.

20. The flexible display panel according to claim 16, wherein, the encapsulation structure includes a first inorganic barrier layer, a second inorganic barrier layer, and an organic barrier layer disposed between the first inorganic barrier layer and the second inorganic barrier layer, and the first inorganic barrier layer is in contact with the surface of the flexible display substrate, and wherein the stacked encapsulation structure includes the organic barrier layer, a portion of the first inorganic barrier layer corresponding to the display region, and a portion of the second inorganic barrier layer corresponding to the display region;

and wherein the inorganic encapsulation structure includes a portion of the first inorganic barrier layer corresponding to the non-display region and a portion of the second inorganic barrier layer corresponding to the non-display region, and wherein the flexible display panel further includes a second barrier layer disposed between the first inorganic barrier layer and the portion of the surface of the flexible display substrate corresponding to the non-display region.

* * * * *